United States Patent

[11] 3,624,466

[72] Inventor George L. Schnable
Lansdale, Pa.
[21] Appl. No. 15,676
[22] Filed Mar. 2, 1970
[45] Patented Nov. 30, 1971
[73] Assignee General Instrument Corporation
Newark, N.J.

[54] DEPLETION-TYPE IGFET HAVING HIGH-CONDUCTIVITY N-TYPE CHANNEL
10 Claims, 6 Drawing Figs.

[52] U.S. Cl. .......... 317/235, 29/576
[51] Int. Cl. .......... H01l 5/00, H01l 11/00, H01l 7/00
[50] Field of Search .......... 317/234, 235; 29/576

[56] References Cited
UNITED STATES PATENTS
3,434,021 3/1969 Hofstein .......... 317/235
3,463,974 8/1969 Kelley .......... 317/235
3,514,676 5/1970 Fa .......... 317/235
3,514,844 6/1970 Bauler et al. .......... 29/571

*Primary Examiner*—James D. Kallam
*Attorneys*—Maxwell James and Harold James

ABSTRACT: A depletion-type insulated gate field effect transistor (IGFET) comprising (1) a P-type semiconductive wafer containing N-type source and drain regions, and a relatively low resistivity N-type region at the surface of said wafer which provides a conductive channel between said source and drain regions, (2) an oxide insulating layer overlying said wafer, and (3) a conductive gate electrode overlying the part of said insulating layer which overlies said conductive channel. During its fabrication, the IGFET is heat treated by baking it at at least 500° C. for about several hours or longer; this provides in said oxide layer a sufficient density of positive charges to induce more than about $5\times10^{11}$ electrons per square centimeter at the surface of the wafer between the source and drain regions, thereby to create said N-type region at the surface of said wafer.

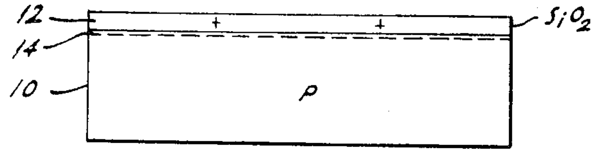

FIG. 1A.
SECTIONAL VIEW OF SI WAFER WITH OXIDE FILM

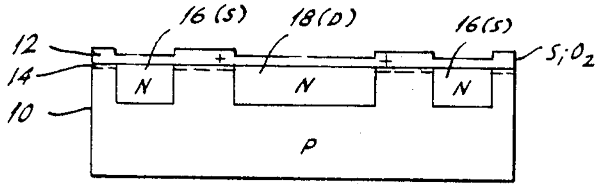

FIG. 1B.
FIG. 1A. WAFER AFTER DIFFUSION OF DRAIN REGION AND SURROUNDING SOURCE REGION

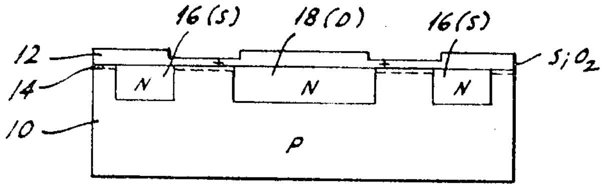

FIG. 1C.
FIG. 1B. WAFER AFTER REDUCTION OF OXIDE THICKNESS OVER AREA BETWEEN SOURCE AND DRAIN

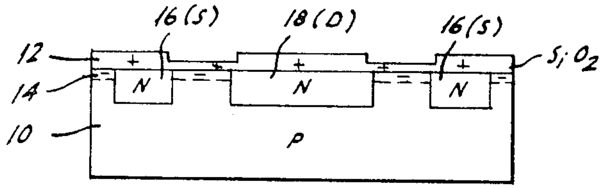

FIG. 1D.
FIG. 1C. WAFER AFTER HEAT TREATMENT OF OXIDE FILM

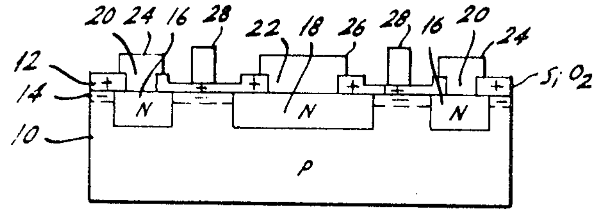

FIG. 1E.
FIG. 1D. WAFER AFTER MAKING OXIDE CUTS AND METALLIZING SOURCE, DRAIN, AND GATE

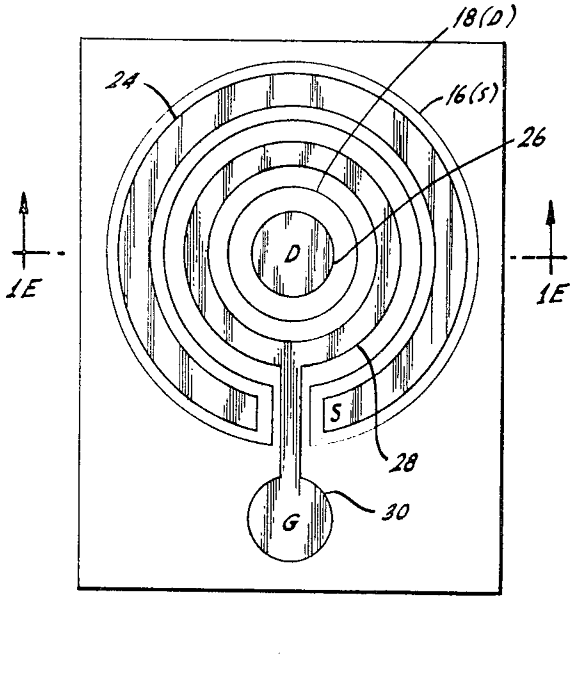

FIG. 2.
PLAN VIEW OF FIG. 1E WAFER

INVENTOR.
GEORGE L. SCHNABLE

D.R. Pressman

ATTORNEY

DEPLETION-TYPE IGFET HAVING HIGH-CONDUCTIVITY N-TYPE CHANNEL

BACKGROUND OF THE INVENTION

Insulated Gate Field Effect Transistors (IGFETs) currently are replacing bipolar or conventional transistors in many applications because IGFETs have smaller size and lower cost than their bipolar counterparts. Two types of IGFETs exist: enhancement and depletion. In an enhancement-type IGFET (which is the more popular), the source-to-drain circuit is substantially nonconductive in absence of any gate bias; application of an input voltage of one polarity to the gate increases the conductance (lowers the resistance) between the IGFET's source and drain regions, creating a conductive source-to-drain circuit. In a depletion-type IGFET, the source-to-drain circuit is conductive in absence of a gate bias; application of an input voltage of one polarity to the gate decreases the conductance (increases the resistance) between the IGFET's source and drain regions.

A depletion-type IGFET comprises a wafer of semiconductive material of one conductivity type having at the surface thereof spaced source and drain regions of the opposite conductivity type. Overlying the surface of the chip is an oxide insulating layer and overlying the part of the oxide layer which overlies the portion of the chip between the source and drain regions is a conductive gate electrode. Incorporated in the oxide layer are fixed charges which induce in the surface of the chip charges of the opposite polarity, viz, charges having the polarity of the source and drain regions. These charges invert to the conductivity type of the source and drain regions the conductivity type of, inter alia, the surface of the portion of the chip which separates the source and drain regions thereby providing a conductive channel from source to drain. In operation, a potential is applied to the gate electrode which reduces or overcomes the effect of the charges in the oxide layer on the inverted region, thereby lowering the conductivity (increasing the resistance) of the channel from source to drain for small gate voltages, and eliminating the inversion region so as to eliminate the conductive channel from source to drain for large gate voltages.

The depletion-type IGFET has several disadvantages which account for the enhancement-type IGFET's greater popularity. The lowest resistance of a depletion-type IGFET's inverted region between source and drain, which, as explained supra, occurs when there is no bias applied to its gate electrode, is not low enough to make the depletion-type IGFET desirable for use as a circuit device. For example, when a depletion-type IGFET is used as the inverter transistor in a circuit for inverting binary signals, its lowest resistance is not low enough, in relation to the resistance of typically valued load resistors, to provide in combination with such a resistor a sufficiently high-ratio voltage divider to cause the inverter circuit's output voltage to be sufficiently close to the potential of one terminal of the bias source for reliable use in direct-coupled circuits.

Similarly, since the lowest resistance of a depletion-type IGFET is relatively high, there is not much spread between the values of its "on" and "off" resistances. Hence, a depletion-type IGFET is unable to produce a large spread in output voltage levels when it is used as the active transistor in an inverting or amplifying stage. Also its high "on" channel resistance prevents it from handling relatively large currents.

The lowest resistance of a depletion-type IGFET is relatively high because there is a relatively small charge concentration in the inverted region when no input voltage is applied to the gate electrode. This enables a relatively low gate voltage, typically on the order of 1.5 v., to overcome this small charge concentration and eliminate the inverted region. Thus a depletion IGFET has a relatively small operating range of input voltages (0 to 1.5 v.). This is undesirable because the IGFET can easily be switched by small signals or their equivalent, such as noise impulses, lateral ion migration over the IGFET's surface oxide, and radiation effects.

Elimination of the above disadvantages would render the depletion-type IGFET superior to its enhancement-type counterpart in applications where speed is desired. Since (in contrast to an enhancement-type IGFET) the gate electrode of a depletion-type IGFET does not have to overlap its source and drain regions, its gate-wafer parasitic capacitance can be made lower than that of an enhancement-type IGFET, whereby higher speed capability and hence, reduced distortion, is provided. Thus, the provision of an increase in the conductance of a depletion IGFET will increase the maximum operating speed of IGFET's.

Accordingly, several objects of the present invention are: (1) to provide a depletion-type IGFET with (*a*) an increased inversion region conductance, (*b*) a larger operating range of gate voltages and higher current handling capacity, (*c*) an increased output voltage swing when used in an amplifying stage, (*d*) an increased immunity to lateral surface ion migration effects, (*e*) an increased noise immunity, and (*f*) an increased immunity to radiation effects; (2) to provide an IGFET with higher speed capability and less distortion than heretofore attainable; and (3) to provide a novel depletion-type IGFET and a novel fabrication process therefor.

BRIEF DESCRIPTION OF THE DRAWINGS

FIGS. 1A to 1E show sectional views of a device according to the invention in various successive stages of its manufacture, wherein:

FIG. 1A shows an oxidized starting wafer,

FIG. 1B shows the chip with source and drain regions,

FIG. 1C shows the wafer after reduction of oxide thickness,

FIG. 1D shows the wafer after heat treatment, and

FIG. 1E shows the completed wafer after metallization.

FIG. 2 is a plan view of the chip of FIG. 1E.

DESCRIPTION OF THE PREFERRED EMBODIMENT

One preferred embodiment of a depletion-type IGFET according to the invention will be described with reference to the successive stages in the fabrication thereof depicted in FIGS. 1A to 1E. Although this description will refer to the formation of a single IGFET within a relatively small wafer, in practice many hundreds of thousands of IGFET's according to the invention can be formed simultaneously within a relatively large wafer according to conventional techniques. Thereafter interconnections may be made between said IGFET's by means of aluminum film strips on the surface of said wafer to form a functional device, such as a shift register.

As shown in the cross section view of FIG. 1A, a starting wafer 10 of P-type monocrystalline silicon of about 5 ohm-cm. resistivity and about 300 microns thick is surface oxidized to form a film 12 of $SiO_2$ about 0.3 micron (3,000 Angstroms) thick thereover. As is well known to those skilled in the art, such oxidization, which is usually performed at a temperature of about 1,200° C., will form immobile positive charges in oxide film 12, as indicated by the "+" signs therein. As is also well known, these charges, which consist of electron-deficient atoms, will repel positive charges in the adjacent upper surface of P-type chip 10, producing a negative inverted-polarity layer 14 at said upper surface. However the number of positive charges in film 12 is relatively small; thus the charge concentration in, and hence the conductivity of, layer 14 is relatively low.

Next, using well-known photochemical techniques, N-type source and drain regions 16 and 18 are diffused into the upper surface of chip 10 as shown in FIG. 1B. As shown in the view of FIG. 2, drain region 18 is circularly shaped while source region 16 is C-shaped and almost surrounds drain region 18 laterally. As a result of this operation, in which oxide film 12 is used as a diffusion mask, film 12 will be reformed to produce an oxide film having depressions over the source and drain regions as indicated. (For clarity, the rear walls of these depressions are not indicated.) The inverted N-type layer 14 forms a conductive, but high-resistance, interconnection between the source and drain regions. Layer 14 also merges with the N-type source and drain regions where said regions have been diffused.

Next, as shown in FIG. 1C, the thickness of oxide film 12 is reduced in those portions thereof which overlie the portion of the wafer between the source and drain regions. Such an operation may be performed using well-known photochemical techniques in which oxide film is removed completely and reformed to have the configuration indicated.

As thus far described, the device comprises a conventional depletion-type IGFET, made by conventional techniques, at a stage in fabrication just prior to formation of the gate electrode. It has all the disadvantages of depletion-type IGFET's aforediscussed.

Next, according to the invention, the device is subjected to a heat treatment which increases the density of positive charges in oxide film 12, as represented by the increased number of "+" signs in FIG. 1D. This increase in positive charges induces more negative charges in inverted layer 14, i.e., in the surface of the P-type portion of chip 10, thereby increasing the conductivity of layer 14. This substantially lowers the resistance of the conductive path provided by layer 14 from source to drain.

Preferably the heat treatment is performed by baking the device at about 500° C. in a "normal" atmospheric environment (i.e., air having about 50 percent relative humidity at about 25° C.) for about 2 hours. Tests showed that such a heat treatment of a silicon wafer having a 0.15-micron thick oxide film increased the positive charge density in said film sufficiently to increase tenfold the electron concentration at the surface of the underlying inverted region, i.e., from about $2\times10^{11}$ electrons per square centimeter to about $2\times10^{12}$ electrons per square centimeter. (Techniques for measuring such charge density, which utilize a capacitance v. voltage measurement of the oxide layer, are discussed by Grove et al. at 8 *Solid State Electronics pp.* 145–163 (1965) and by Cheroff et al. at pp. 416–421 of the *I.B.M. Journal* for Sept. 1964).

Other suitable heat treatments for increasing the fixed charge density in the oxide layer are (1) a bake in dry nitrogen for 2 hours at 500° C., (2) a bake in dry nitrogen for 15 hours at 1200° C. plus slow cooling over a 1-hour interval, and (3) a bake in dry helium at 500° C. for 2 hours. These treatments produced successively lower fixed charge densities than the preferred treatment.

The result of the present process—whereby a relatively high-temperature heat treatment increases the number of fixed charges in the surface oxide layer 12—is anomalous since prior studies have indicated that heat treatment produces no change in or even reduces the number of fixed charges. For example, in the aforecited Cheroff et al. paper, it is reported that a 350° C. heat treatment produced little or no change in the surface charge density in a P-type substrate and actually reduced greatly the surface charge density in an N-type substrate.

The device of FIG. 1D next is metallized in well-known fashion in order to provide a gate electrode and to provide contacts to the source and drain regions. Such metallization is accomplished by first etching openings in oxide layer 12 over the source and drain regions as indicated in FIG. 1E at 20 and 22, respectively. Then a metal layer, usually aluminum, is formed over the wafer's entire surface. This metal layer is masked and selectively etched to leave remaining the portions shown in FIGS. 1E and 2. A source contact 24 contacts the source through oxide opening 20, a drain contact 26 contacts the drain through oxide opening 22, and a gate electrode 28 overlies a portion of the part of oxide layer 12 which overlies the region of the substrate between the source and drain regions.

Since the gate electrode 28 is thinner than the relatively narrow spacing between source and drain, a gate extension which includes a widened portion 30 is provided to which a contact can more readily be attached under the present state of transistor packaging technology. The source has a C-shape (rather than an O-shape) to provide an opening accommodating gate extension 30. However, the source can have an O-shape if the gate is wide enough to attach a contact directly thereto or if suitably packaging technology is developed.

The device of FIG. 1E, when treated according to the preferred method above, will have a sufficient density of fixed positive charges in oxide layer 12 to induce about $2\times10^{12}$ electrons per $cm.^2$ at the surface of the wafer, as indicated diagrammatically at 14. Heretofore the greatest electron charge concentration at the surface of a P-type wafer was about $5\times10^{11}$ electrons per $cm.^2$. The increased charge concentration of the present invention provides a highly conductive channel between source and drain regions, whereby the operating range of gate voltages to switch the device from fully on to fully off will be changed from about 0 to 1.5 volts to about 0 to 15 volts. As will be recognized by those skilled in the art, this improvement is a dramatic one which, because of the depletion-type IGFET's lower capacitance, makes it more than competitive with the enhancement-type IGFET.

The invention is not limited to the preferred embodiment shown, but can employ any configuration, materials, temperatures, times, or other parameters falling within the ambit of the claims. For example, the source and drain regions can have many configurations other than the "C-dot" configuration shown. For example, the drain and source can be parallel rectangles with the gate being a strip overlying the region therebetween. The gate need not be aluminum but can be semiconductive material, as disclosed in the copending application of Watkins and Selser, Ser. No. 861,524, filed July 22, 1969. In this case, the heat treatment step of the invention can be performed at any time after the oxide layer is first grown, since this oxide layer never is removed.

What is claimed is:

1. A depletion-type insulated gate field effect transistor comprising:
   a monocrystalline wafer of semiconductive material of P-conductivity type having a surface,
   said wafer containing source and drain regions, comprising respectively two spaced-apart regions of N-conductivity type within said wafer extending from said surface thereof into said wafer,
   at least the portion of said surface of said wafer separating said spaced-apart regions being covered by a layer of an oxide of said semiconductive material, a conductive gate electrode overlying said oxide layer, said oxide layer having a sufficient density of positive charges for inducing more than $5\times10^{11}$ electrons per square centimeter at said surface of said wafer and thereby providing, in the absence of a bias applied to said gate electrode, a correspondingly lower resistivity N-type inversion layer at said portion of said surface overlying the portion of said wafer between said source and drain regions.

2. The transistor of claim 1 wherein one of said source and drain regions substantially surrounds the other of said source and drain regions and said gate electrode overlies a part only of the portion of said wafer between said source and drain regions.

3. The transistor of claim 1 wherein the portion of said wafer between the opposing edges of said source and drain regions is elongated, said gate is elongated and narrower than said portion of said wafer between said source and drain regions, and said gate electrode surrounds completely one of said source and drain regions.

4. The transistor of claim 1 further including two separate metallic contacts, each extending through a respective opening in said oxide layer, one to said source regions and one to said drain regions.

5. A process for forming a depletion-type insulated gate field effect transistor in a monocrystalline wafer of P- conductivity type having a surface, comprising:
   diffusing spaced-apart N- conductivity-type source and drain regions, respectively, into said surface of said wafer.

forming over at least the portion of said surface of said wafer between said source and drain regions a layer of an oxide of said semiconductive material, baking said oxide layer at a temperature of at least about 500° C. for a sufficient time to provide in said oxide layer a sufficient density of positive charges for inducing more than $5\times10^{11}$ electrons per square centimeter at said surface of said wafer, thereby providing a correspondingly lower resistivity N-type inversion layer at the portion of said surface of said wafer between said source and drain regions, and forming a gate electrode comprising a conductive layer overlying said oxide layer and the portion of said wafer between said source and drain regions.

6. The process of claim 5 wherein said baking is performed in an atmosphere of dry nitrogen at a temperature of about 1,200° C. for about 15 hours.

7. The process of claim 5 wherein said baking is performed in an atmosphere for nitrogen for 2 hours.

8. The process of claim 5 wherein said baking is performed in normal air having a 50 percent relative humidity at a reference temperature of 25° C.

9. The process of claim 5 wherein said oxide layer is formed over said surface of said wafer including said source and drain regions, said process including the additional step of forming separate metallic contacts to said source and drain regions, respectively, through respective openings in said oxide layer.

10. The process of claim 5 wherein said source and drain regions are shaped and aligned such that an elongated portion of said wafer separates the opposing edges of said source and drain regions and said gate electrode is elongated and aligned with said elongated portion of said wafer between said source and drain regions and is narrower than said elongated portion of said wafer.

* * * * *